(12) United States Patent
Kim et al.

(10) Patent No.: US 10,790,278 B2
(45) Date of Patent: Sep. 29, 2020

(54) SEMICONDUCTOR DEVICE INCLUDING VERTICAL FIELD EFFECT TRANSISTORS HAVING DIFFERENT GATE LENGTHS

(71) Applicant: Samsung Electronics Co., Ltd., Suwon-si, Gyeonggi-do (KR)

(72) Inventors: Mingyu Kim, Hwasung-si (KR); Kang-Ill Seo, Eumseong-gun (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/275,761

(22) Filed: Feb. 14, 2019

(65) Prior Publication Data

US 2020/0020685 A1  Jan. 16, 2020

Related U.S. Application Data

(60) Provisional application No. 62/697,465, filed on Jul. 13, 2018.

(51) Int. Cl.
| | | |
|---|---|---|
| *H01L 27/088* | (2006.01) | |
| *H01L 29/423* | (2006.01) | |
| *H01L 29/66* | (2006.01) | |
| *H01L 21/8234* | (2006.01) | |
| *H01L 21/308* | (2006.01) | |
| *H01L 29/78* | (2006.01) | |

(52) U.S. Cl.
CPC ........ *H01L 27/088* (2013.01); *H01L 21/3086* (2013.01); *H01L 21/823456* (2013.01); *H01L 21/823468* (2013.01); *H01L 21/823487* (2013.01); *H01L 29/42376* (2013.01); *H01L 29/66666* (2013.01); *H01L 29/7827* (2013.01)

(58) Field of Classification Search
CPC ......... H01L 29/7827; H01L 21/823487; H01L 21/823456; H01L 21/823807; H01L 29/42376
See application file for complete search history.

(56) References Cited

U.S. PATENT DOCUMENTS

| | | |
|---|---|---|
| 7,161,215 B2 | 1/2007 | Chakihara et al. |
| 7,190,031 B2 | 3/2007 | Chakihara et al. |
| 7,495,289 B2 | 2/2009 | Chakihara et al. |
| 7,701,020 B2 | 4/2010 | Chakihara et al. |
| 7,972,920 B2 | 7/2011 | Chakihara et al. |
| 8,476,138 B2 | 7/2013 | Chakihara et al. |

(Continued)

FOREIGN PATENT DOCUMENTS

| | | |
|---|---|---|
| JP | 4729609 B2 | 7/2011 |
| JP | 2013062350 A | 4/2013 |

*Primary Examiner* — Changhyun Yi
(74) *Attorney, Agent, or Firm* — Harness, Dickey & Pierce, P.L.C.

(57) ABSTRACT

A semiconductor device including a semiconductor substrate having a recessed top portion and a non-recessed top portion, a first fin protruding upward from a non-recessed top portion with a first thickness, a second fin protruding upward from the recessed top portion with a second thickness greater than the first thickness, a first gate structure on the non-recessed top portion and surrounding the first fin to a first height from the non-recessed top portion, and a second gate structure on the recessed top portion and surrounding the second fin to a second height different from the first height from the recessed top portion may be provided.

17 Claims, 23 Drawing Sheets

(56) References Cited

U.S. PATENT DOCUMENTS

| | | |
|---|---|---|
| 9,786,774 B2 | 10/2017 | Colinge et al. |
| 9,881,842 B1 | 1/2018 | Chung et al. |
| 9,911,848 B2 | 3/2018 | Diaz et al. |
| 9,929,058 B2 | 3/2018 | Mallela et al. |
| 2011/0233512 A1 | 9/2011 | Yang et al. |
| 2017/0194330 A1 | 7/2017 | Lee et al. |
| 2017/0229558 A1 | 8/2017 | Anderson et al. |
| 2019/0214305 A1* | 7/2019 | Bao .................. H01L 29/78618 |

* cited by examiner

100a

SEMICONDUCTOR DEVICE INCLUDING VERTICAL FIELD EFFECT TRANSISTORS HAVING DIFFERENT GATE LENGTHS

CROSS-REFERENCE TO RELATED APPLICATION

This non-provisional application claims priority from U.S. Provisional Patent Application No. 62/697,465 filed on Jul. 13, 2018 in the U.S. Patent and Trademark Office, and all the benefits accruing therefrom under 35 U.S.C. 119, the contents of which are incorporated herein by reference in its entirety.

BACKGROUND

1. Field

Some example embodiments of the inventive concepts disclosed herein relate to semiconductor devices including vertical field effect transistors (VFETs) having different gate lengths and/or manufacturing methods thereof.

2. Description of the Related Art

Due to enhanced scalability and lower middle-of-line (MOL) capacitance and/or a relatively lower contact resistance in the transistor structure, a vertical field effect transistor (VFET) has been extensively studied as a desirable alternative for a fin field effect transistor (FinFET) and/or a horizontal nanosheet field effect transistor (HNS FET).

A VFET are being implemented using a fin protruding from a semiconductor substrate and a gate surrounding the fin. Further, a VFET has a design freedom with regard to a channel length because the channel length can be defined by a height of the gate surrounding the fin. Thus, a VFET can be designed to be free from the so-called short channel effect.

SUMMARY

Some example embodiments of the inventive concepts disclosed herein relate to semiconductor devices including vertical field effect transistors (VFETs) having different gate lengths.

Some example embodiments of the inventive concepts disclosed herein relate to methods of manufacturing semiconductor devices including VFETs having different gate lengths.

According to an example embodiment of the inventive concepts, a semiconductor device including at least two VFETs having different gate lengths includes a semiconductor substrate including a top surface and a bottom surface, the top surface including a first top surface portion at a first height with respect to the bottom surface of the semiconductor substrate and a second top surface portion at a second height with respect to the bottom surface of the semiconductor substrate, the first height being different from the second height, a first fin protruding from the first top surface portion of the semiconductor substrate, a second fin protruding from the second top surface portion of the semiconductor substrate, a top of the first fin and a top of the second fin being at a same level, a first gate structure on the first top surface portion of the semiconductor substrate, the first gate structure including a first gate insulating layer and a first gate conductive layer on the first gate insulating layer, the first gate structure including a first portion surrounding the first fin to a first thickness from the top surface of the semiconductor substrate and a second portion on the semiconductor substrate and connected to the first portion, and a second gate structure on the second top surface portion of the semiconductor substrate, the second gate structure including a second gate insulating layer and a second gate conductive layer on the second gate insulating layer, the second gate structure including a third portion surrounding the second fin to a second thickness from the top surface of the semiconductor substrate and a fourth portion on the top surface of the semiconductor substrate and connected to the third portion, the first thickness and the second thickness being different from each other.

According to an example embodiment of the inventive concepts, a semiconductor device including at least two VFETs having different gate lengths includes a semiconductor substrate including a top surface having a recessed top portion and a non-recessed top portion, a first fin protruding upward from the non-recessed top portion of the semiconductor substrate and having a first thickness, a second fin protruding upward from the recessed top portion of the semiconductor substrate and having a second thickness, the second thickness being greater than the first thickness, a first gate structure on the non-recessed top portion of the semiconductor substrate, the first gate structure including a first gate insulating layer and a first gate conductive layer on the first gate insulating layer, the first gate structure including a first portion surrounding the first fin to a first height from the non-recessed top portion of the semiconductor substrate and a second portion on the non-recessed top portion and connected to the first portion, and a second gate structure on the recessed top portion of the semiconductor substrate, the second gate structure including a second gate insulating layer and a second gate conductive layer on the second gate insulating layer, the second gate structure including a third portion surrounding the second fin to a second height from the recessed top portion and a fourth portion on the recessed top portion and connected to the third portion, the first height and the second height being different from each other.

According to an example embodiment of the inventive concepts, a semiconductor device including at least two VFETs having different gate lengths includes a first VFET and a second VFET. The first VFET may include a first fin serving as a channel for the first VFET, the first fin protruding from a first portion of a top surface of a semiconductor substrate, and a first gate structure surrounding a sidewall of the first fin. The second VFET may include a second fin serving as a channel for the second VFET, the second fin protruding from a second portion of the top surface of the semiconductor substrate, and a second gate structure surrounding a sidewall of the second fin. The second portion may be lower than the first portion. A top surface of the first fin may be substantially at a same level as a top surface of the second fin. A top of the second gate structure may be substantially at a same level as a top of the first gate structure.

According to an example embodiment of the inventive concepts, a method for manufacturing a semiconductor device including at least two VFETs having different gate lengths includes providing a semiconductor substrate, forming a plurality of preliminary fins by etching the semiconductor substrate using a first mask pattern, forming a plurality of fins including a first fin and a second fin from the plurality of preliminary fins by additionally etching the select region of the semiconductor substrate using a second mask pattern, the first fin having a first thickness in a non-select region of the semiconductor substrate and the second fin having a second thickness in a select region of the semiconductor substrate, the second thickness being greater than the first thickness, forming a gate insulating layer on the first fin and the second fin, forming a gate conductive layer on the gate insulating layer, and forming a hard mask pattern to expose top portions of a stacked structures of the gate insulating layer and the gate conductive layer, forming a plurality of gate structures by etching the exposed top portions of the stacked structure of the gate conductive layer and the gate insulating layer to expose the first mask pattern using the hard mask pattern as an etch mask, the plurality of gate structures including the first gate structure including a first portion surrounding the first fin to a first height from a top surface of the semiconductor substrate and a second portion extending on the semiconductor substrate and horizontally extending from a bottom area of the first portion, and a second gate structure including a second gate insulating layer pattern and a second gate conductive layer pattern on the second gate insulating layer pattern, the second gate structure including a third portion surrounding the second fin to a second height from the top surface of the semiconductor substrate and a fourth portion on the semiconductor substrate and horizontally extending from a bottom area of the third portion, the first height and the second height being different from each other.

BRIEF DESCRIPTION OF THE DRAWINGS

The above and other objects, features and effects of inventive concepts will become more apparent to those of ordinary skill in the art by describing in detail example embodiments thereof with reference to the accompanying drawings, in which.

DETAILED DESCRIPTION

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof. (Expressions such as "at least one of," when preceding a list of elements, modify the entire list of elements and do not modify the individual elements of the list.)

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In certain semiconductor devices implemented by vertical field effect transistors (VFETs), it may be desirable to provide VFETs having different gate lengths on a same substrate. For example, when a logic device and a Static Random Access Memory (SRAM) (or a nominal VFET and wimpy VFET) included in a semiconductor device may be implemented using VFETs, it may be desirable to implement the logic device and the SRAM to have different gate lengths based on desired characteristics of the semiconductor device. The example embodiments described herein below provide semiconductor devices including VFETs having different gate lengths and/or manufacturing methods thereof.

Hereinafter, some example embodiments of the present inventive concepts will be explained with reference to the accompanying drawings.

Figure 1A:
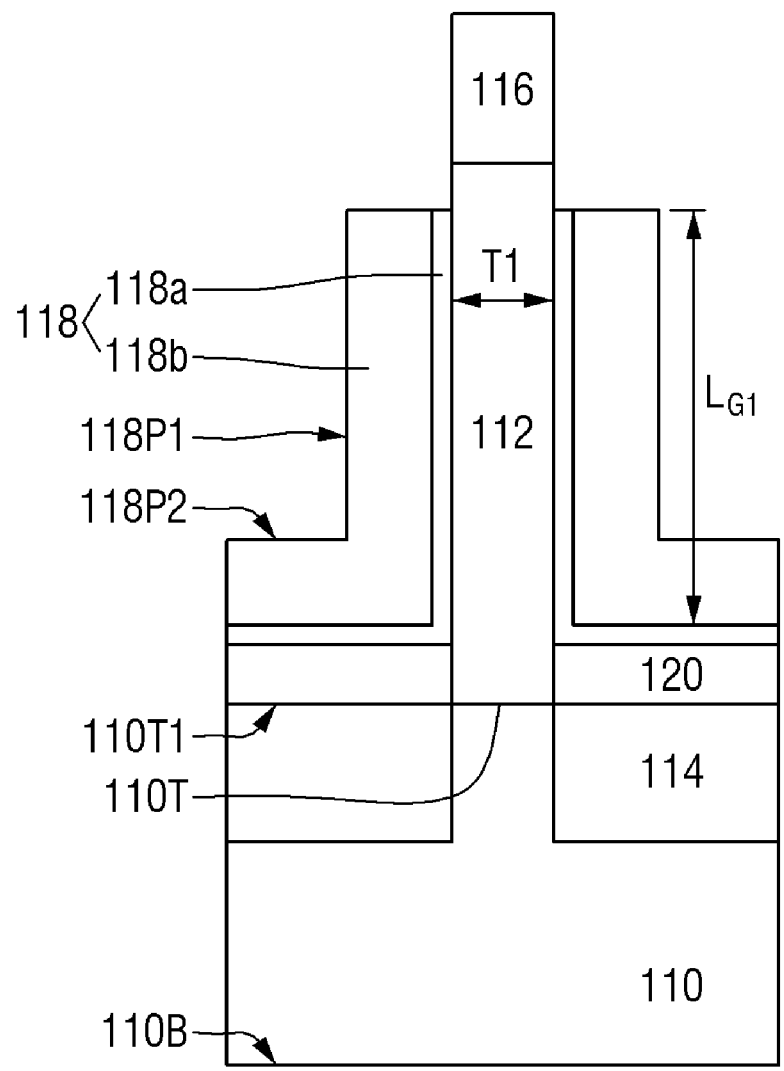
FIGS. 1A and 1B shows two vertical filed effect transistors (VFETs) included a semiconductor device and having different gate lengths from each other according to an example embodiment of the present inventive concepts.
Figure 1B:
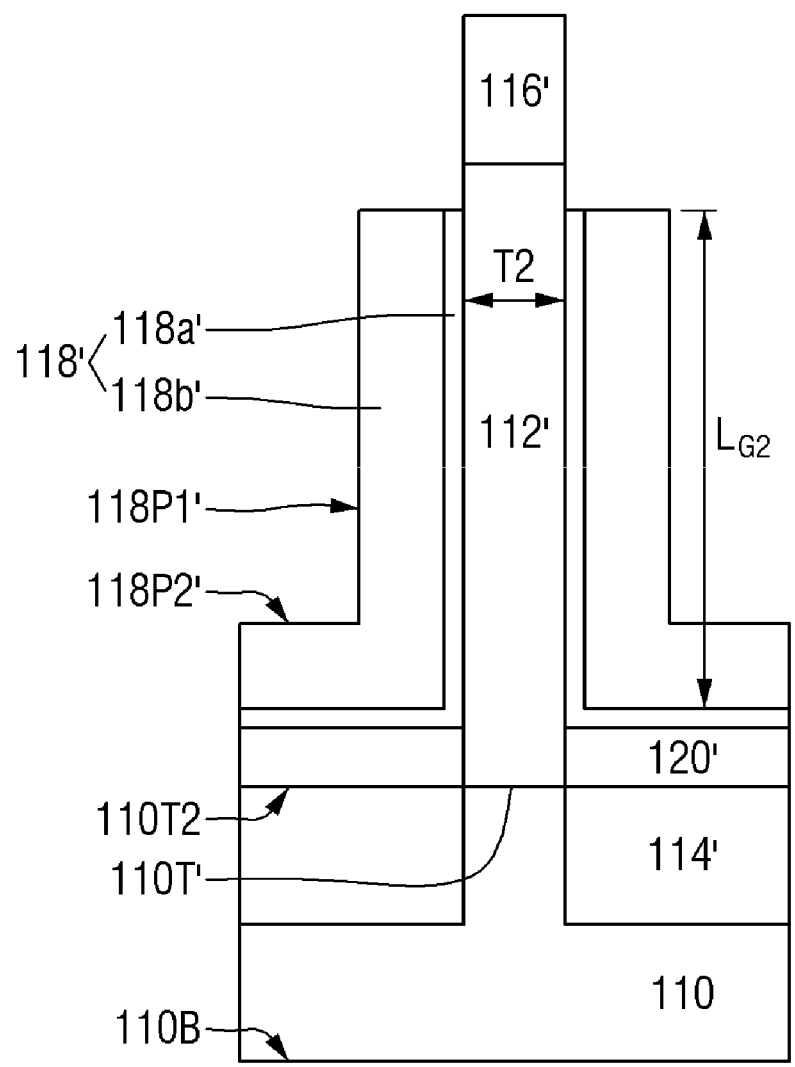

FIGS. 1A and 1B shows two vertical filed effect transistors (VFETs) 100a and 100b included a semiconductor device and having different gate lengths from each other according to an example embodiment of the present inventive concepts. Although this example embodiment relates to an example in which the semiconductor device includes VFETs having two different gate lengths, example embodiments of the present inventive concepts are not limited thereto. In some example embodiments, the semiconductor device may include VFETs having three or more different gate lengths.

Referring to FIG. 1A, a first VFET 100a includes a first fin 112 protruding from a semiconductor substrate 110, a first bottom source/drain region 114 in the semiconductor substrate 110 at a side of the first fin 112, a first top source/drain region 116 on the first fin 112, a first gate structure 118 surrounding a side of the first fin 112 to a certain height, and a first spacer layer pattern 120 between the first bottom source/drain region 114 and the first gate structure 118. The first gate structure 118 may include a first gate insulating layer 118a and a first gate conductive layer 118b on the first gate insulating layer 118a, the first gate insulating layer 118a being between the first gate conductive layer 118b and the first fin 112, and between the first gate conductive layer 118b and the first spacer layer pattern 120.

Referring to FIG. 1B, a second VFET 100b includes a second fin 112' protruding from a semiconductor substrate 110, a second bottom source/drain region 114' in the semiconductor substrate 110 at a side of the second fin 112', a second top source/drain region 116' on the second fin 112', a second gate structure 118' surrounding a side of the second fin 112' to a certain height, and a second spacer layer pattern 120'. The second gate structure 118' may include a second gate insulating layer 118a' and a second gate conductive layer 118b' on the second gate insulating layer 118a', the second gate insulating layer 118a' being between the second gate conductive layer 118b' and the second fin 112' and between the second gate conductive layer 118b' and the second spacer layer pattern 120'.

The semiconductor substrate 110 includes a top surface and a bottom surface 110B opposite to the top surface. The top surface of the semiconductor substrate 110 may include a first top surface portion 110T1 at a first height with respect to the bottom surface 110B of the semiconductor substrate 110 (see FIG. 1A) and a second top surface portion 110T2 at a second height with respect to the bottom surface 110B of the semiconductor substrate 110 (see FIG. 1B). The first height may be different from the second height.

Referring again to FIGS. 1A and 1B, the first fin 112 may protrude from the first top surface portion 110T of the semiconductor substrate 110. The second fin 112' may protrude from the second top surface portion 110T' of the semiconductor substrate 110. In some example embodiments, a top of the first fin 112 and a top of the second fin 112' may be at a same level in a vertical direction.

The first gate structure 118 may be provided on the first top surface portion 110T1 of the semiconductor substrate 110, and may include, for example, the first gate insulating layer 118a and the first gate conductive layer 118b on the first gate insulating layer 118a. The first gate structure 118 may include a first portion 118P1 surrounding the first fin 112 to a first thickness $L_{G1}$ from the first top surface portion 110T1 of the semiconductor substrate 110 and a second portion 118P2 on the first top surface portion 110T1 of the semiconductor substrate 110 and horizontally extending from a bottom area of the first portion 118P1. In other words, the first gate structure 118 may include the second portion 118P2 horizontally extending along the first top surface portion 110T1 of the semiconductor substrate 110 and the first portion 118P1 vertically extending from an area of the second portion 118P2 adjoining the first fin 112 and surrounding the first fin 112 such that the first gate structure 118 have a first thickness $L_{G1}$ from the first top surface portion 110T1 of the semiconductor substrate 110.

The second gate structure 118' may be provided on the second top surface portion 110T2 of the semiconductor substrate 110, and may include the second gate insulating layer 118a' and the second gate conductive layer 118b' on the second gate insulating layer 118a'. The second gate structure 118' may include a third portion 118P1' surrounding the second fin 112' to a second thickness $L_{G2}$ from the second top surface portion 110T2 of the semiconductor substrate 110 and a fourth portion 110P2' on the second top surface portion 110T2 of the semiconductor substrate 110 and horizontally extending from a bottom area of the third portion 118P1'. In other words, the second gate structure 118' may include the fourth portion 118P2 horizontally extending along the second top surface portion 110T2 of the semiconductor substrate 110 and the third portion 118P1' vertically extending from an area of the fourth portion 118P2' adjoining the second fin 112' and surrounding the second fin 112' such that the second gate structure 118' have a second thickness $L_{G2}$ from the second top surface portion 110T2 of the semiconductor substrate 110. Thus, the first thickness $L_{G1}$ may be thicker than the second thickness $L_{G2}$.

In some example embodiments, the first height of the first top surface portion 110T1 of the semiconductor substrate 110 may be at a higher level than the second height of the second top surface portion 110T2 of the semiconductor substrate 110 with respect to the bottom surface 110B of the semiconductor substrate 110, and a top of the first gate structure and a top of the second gate structure may be substantially at a same level.

The spacer layer patterns 120 and 120' may be provided between the second portion 118P2 of the first gate structure 118 and the semiconductor substrate 110 and between the fourth portion 118P2' of the second gate structure 118' and the semiconductor substrate 110, respectively.

The first bottom source/drain region 114 may be provided in the semiconductor substrate 110. The first bottom source/drain region 114 may be provided at a side of the first fin 112. The second bottom source/drain region 114' may be provided in the semiconductor substrate 110. The second bottom source/drain region 114' may be provided at a side of the second fin 112'. Further, the first spacer layer pattern 120 may be provided between the second portion 118P2 of the first gate structure 118 and the first bottom source/drain region 114, and the second spacer layer pattern 120' may be provided between the fourth portion 118P2' of the second gate structure 118' and the second bottom source/drain region 114'.

The first top source/drain region 116 may be provided on the first fin 112, and the second top source/drain region 116' may be provided on the second fin 112'.

The two vertical filed effect transistors (VFETs) included a semiconductor device as illustrate in FIGS. 1A and 1B may be described differently as follows.

The semiconductor substrate 110 may include a top surface, which includes a recessed top portion (or alternatively, the first top surface portion) 110T2 and a non-recessed top portion (or alternatively, the second top surface portion) 110T1. The first fin 112 may protrude upward from the non-recessed top portion 110T1 of the semiconductor substrate 110 with a first thickness T1. The second fin 112' may protrude upward from the recessed top portion 110T2 of the semiconductor substrate 110 with a second thickness T2. The second thickness T2 may be greater than the first thickness T1.

The first gate structure 118 may be provided on the non-recessed top portion 110T1 of the semiconductor substrate 110. The first gate structure 118a may include the first gate insulating layer 118a and the first gate conductive layer 118b on the first gate insulating layer 118a, the first gate insulating layer 118a being between the first gate conductive layer 118b and the first fin 112, and between the first gate conductive layer 118b and the first spacer layer pattern 120. The first gate structure 118 may include a first portion 118P1 surrounding the first fin 112 to a first height $L_{G1}$ from the non-recessed top portion 110T1 and a second portion 118P2 on the non-recessed top portion 110T1 of the semiconductor substrate 110 and horizontally extending from a bottom area of the first portion 118P1 along the non-recessed top portion 110T1. In other words, the first gate structure 118 may include the second portion 118P2 horizontally extending along the non-recessed top portion 110T1 of the semiconductor substrate 110 and the first portion 118P1 vertically extending from an area of the second portion 118P2 adjoining to the first fin 112 and surrounding the first fin 112 such that the first gate structure 118 have the first thickness $L_{G1}$ from the non-recessed top portion 110T1 of the semiconductor substrate 110.

The second gate structure 118' may be provided on the recessed top portion 110T2 of the semiconductor substrate 110. The second gate structure 118' may include the second gate insulating layer 118a' and the second gate conductive layer 118b' on the second gate insulating layer 118a', the second gate insulating layer 118a' being between the second gate conductive layer 118b' and the second fin 112' and between the second gate conductive layer 118b' and the second spacer layer pattern 120'. The second gate structure 118' may include a third portion 118P1' surrounding the second fin 112' to a second height $L_{G2}$ from the recessed top portion 110T2 and a fourth portion 118P2' on the recessed top portion 110T2 of the semiconductor substrate 110 and horizontally extending from a bottom area the third portion 118P1'. In other words, the first gate structure 118 may include the second portion 118P2 horizontally extending along the recessed top portion 110T2 of the semiconductor substrate 110 and the third portion 118P1' vertically extending from an area of the fourth portion 118P2' adjoining to the second fin 112' and surrounding the second fin 112' such that the second gate structure 118' have the second thickness $L_{G2}$ from the recessed top portion 110T2 of the semiconductor substrate 110.

In some example embodiments, a top of the first fin 112 and a top of the second fin 112' may be substantially at a same level. Further, a top of the first gate structure 118 and a top of the second gate structure 118' may be substantially at a same level.

The first and second spacer layer patterns 120 and 120' may be provided between the second portion 118P2 of the first gate structure 118 and the non-recessed top portion 110T1 of the semiconductor substrate 110 and between the fourth portion 118P2' of the second gate structure 118' and the recessed top portion 110T2 of the semiconductor substrate 110, respectively.

The first bottom source/drain region 114 may be provided in the semiconductor substrate 110. The first bottom source/drain region 114 may be provided at a side of the first fin 112. The second bottom source/drain region 114' may be provided in the semiconductor substrate 110. The second bottom source/drain region 114' may be provided at a side of the second fin 112'.

The first top source/drain region 116 may be provided on the first fin 112, and the second top source/drain region 116' may be provided on the second fin 112'.

According to this example embodiment of the present inventive concepts, a semiconductor device including at least two VFETs having different gate lengths may be provided.

According to this example embodiment of the present inventive concepts, at least two VFETs included in a semiconductor device may be implemented to have different gate lengths while having a top of the first gate structure and a top of the second gate structure substantially at a same level.

Figure 2:
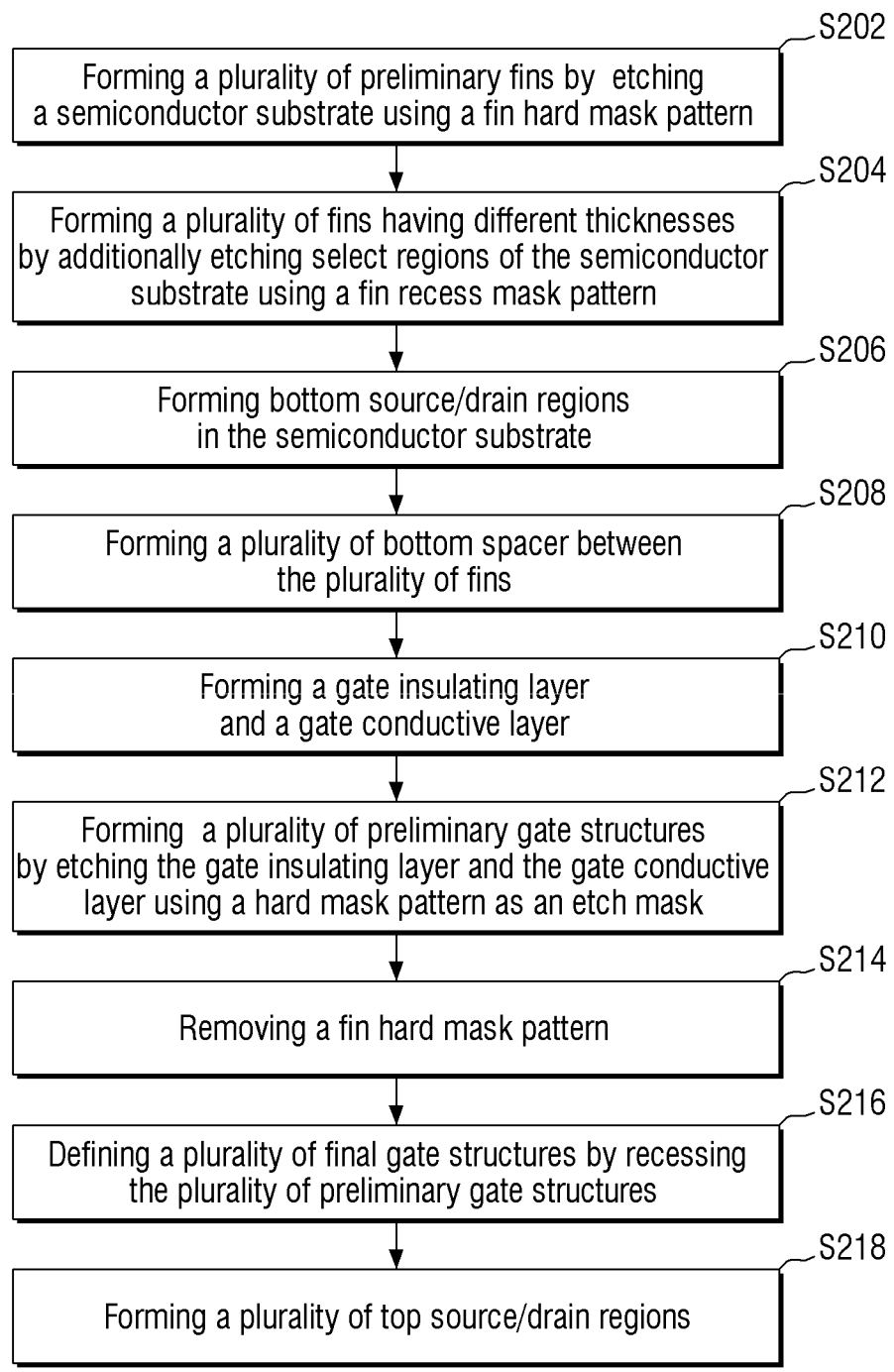
FIG. 2 is a flow diagram illustrating a method of manufacturing a semiconductor device including the two VFETs of FIGS. 1A and 1B, according to an example embodiment of the present inventive concepts.

FIG. 2 is a flow diagram illustrating a method of manufacturing a semiconductor device including the two VFETs as illustrated in FIGS. 1A and 1B, according to an example embodiment of the present inventive concepts.

Referring to FIG. 2, the method of manufacturing a semiconductor device including the two VFETs as illustrated in FIGS. 1A and 1B includes operations S202, S204, S206 . . . S218. In operation S202, a plurality of preliminary fins may be formed by etching a semiconductor substrate using a fin hard mask pattern.

In operation S204, a plurality of fins having different thicknesses may be formed by additionally etching a select region of the semiconductor substrate using a fin recess mask pattern. For example, the plurality of fins may include a first fin having a first thickness in a non-select region of the semiconductor substrate and a second fin having a second thickness in the select region of the semiconductor substrate.

In operation S206, after removing the fin recess mask pattern, a plurality of bottom source/drain regions may be formed in the semiconductor substrate using the plurality of fins (as well as the fin hard mask pattern on each of the plurality of fins) as an etch mask.

In operation S208, bottom spacers may be formed between the plurality of fins.

In operation S210, a gate insulating layer and a gate conductive layer may be formed. In particular, the gate insulating layer and the gate conductive layer may be conformally deposited on the plurality of fins.

In operation S212, a first insulation layer may be formed and etched back to leave self-aligned spacers on sides of each of the plurality of fins in a cross-sectional view, while exposing top portions of gate stack structures of the gate insulating layer and the gate conductive layer. Then, a plurality of preliminary gate structures may be formed by etching the top portions of the gate stack structure by using the self-aligned spacers as an etch mask. The plurality of preliminary gate structures may have different gate lengths in a vertical direction due to height differences between the plurality of fins.

In operation S214, after forming the plurality of gate structures, pieces of the fin hard mask pattern provided on the plurality of fins and exposed by the plurality of gate structures may be removed.

In operation S216, the plurality of final gate structures may be formed by recessing the plurality of preliminary gate structures using one or more insulating layers as a recess mask. The plurality of gate structures may have different gate lengths different gate lengths in a vertical direction.

In operation S218, a plurality of top source/drain regions may be formed on top surfaces of the plurality of fins at which the fin hard mask pattern is removed, respectively. Thus, a semiconductor device including two or more VFETs having at least two different gate lengths may be provided. Thus, the VFETs each including a bottom source/drain region in the semiconductor substrate at both sides of a corresponding fin (which serves as a channel), a gate structure surrounding a side surface of the corresponding fin, and a top source/drain region on a top surface of the corresponding fin may be formed.

FIGS. 3A, 3B, 4A, 4B . . . and 12A and 12B are cross-sectional views to explain a method of manufacturing the VFET illustrated in FIGS. 1A and 1B and the operations shown in FIG. 2, according to an example embodiment of the inventive concepts. For brevity's sake, previously described elements may be identified by similar or identical reference numbers without repeating overlapping descriptions thereof.

Figure 3A:
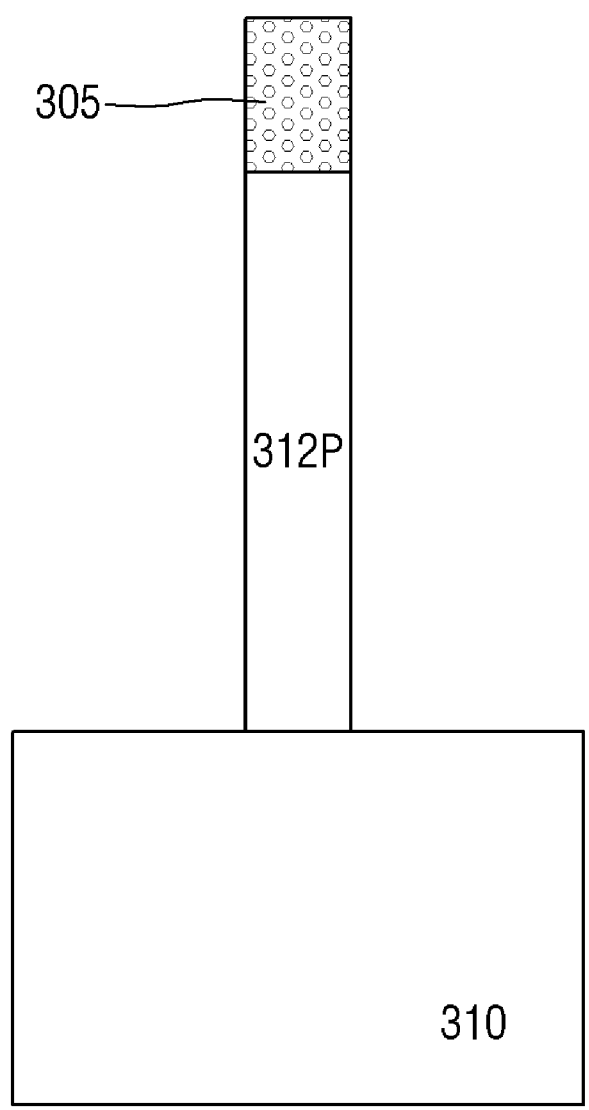
FIGS. 3A, 3B, 4A, 4B, 5A, 5B, 6A, 6B, 7A, 7B, 8A, 8B, 9A, 9B, 10A, 10B, 11A, 11B, 12A and 12B are cross-sectional views to explain a method of manufacturing the VFET illustrated in FIGS. 1A and 1B and the operations shown in FIG. 2, according to an example embodiment of the inventive concepts.
Figure 3B:
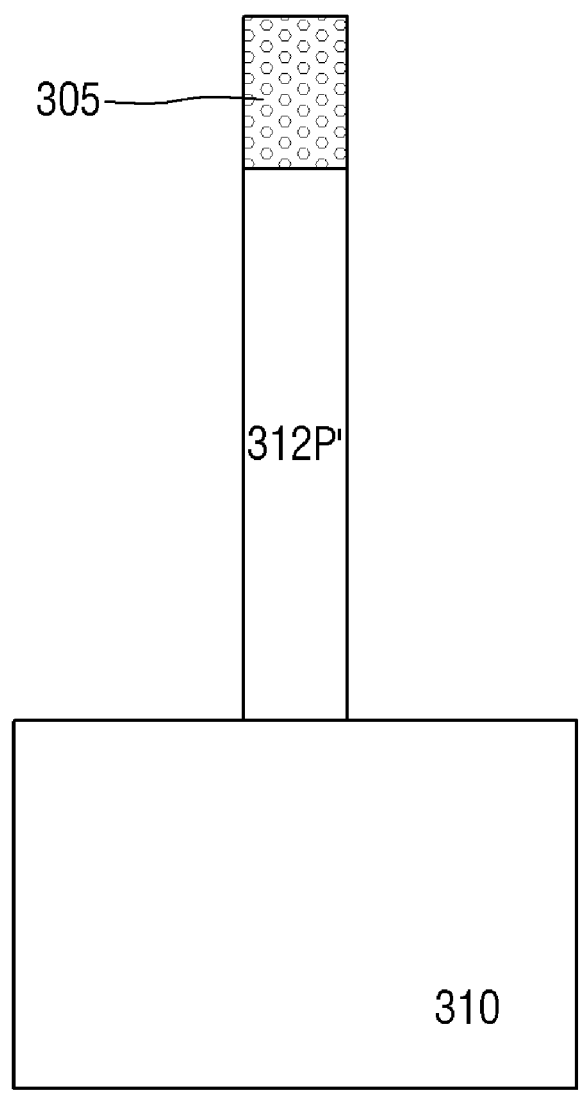

FIGS. 3A and 3B are cross-sectional views to explain operation S202 of FIG. 2. Referring to FIGS. 3A and 3B, a fin hard mask pattern 305 may be provided on a semiconductor substrate 310. Throughout this specification, the term "mask" and "mask pattern" will be used interchangeably. Then, the semiconductor substrate 310 may be etched to a first depth using the fin hard mask 305 as an etch mask to form a plurality of preliminary fins 312P.

The substrate 310 may be a bulk silicon. For example, the substrate 310 may be a silicon substrate, or may include a material other than silicon, including but not limited to Ge, SiGe, SiC, GeP, GeN, InGaAs, GaAs, InSb, InAs, GaSb, and InP. The semiconductor substrate 310 may be a portion of a bulk silicon wafer.

The substrate 310 may be a silicon-on-insulator (SOI). The substrate 310 may be a silicon portion of a Silicon-On-Insulator (SOI) wafer. In some example embodiments, the substrate 310 may refer to a semiconductor layer epitaxially grown on a base substrate.

The plurality of preliminary fins 312P may be formed to extend along a direction by etching the semiconductor substrate 310 using the fin hard mask pattern 305. For example, the fin hard mask pattern 305 may include amorphous carbon layer, an organic dielectric, and/or a silicon nitride (SiN) material. In some example embodiments, the plurality of preliminary fins 312P may be formed using an epitaxial growth process on select regions of the semiconductor substrate 310 that are not covered by a mask pattern, instead of etching the semiconductor substrate 310.

Figure 4A:
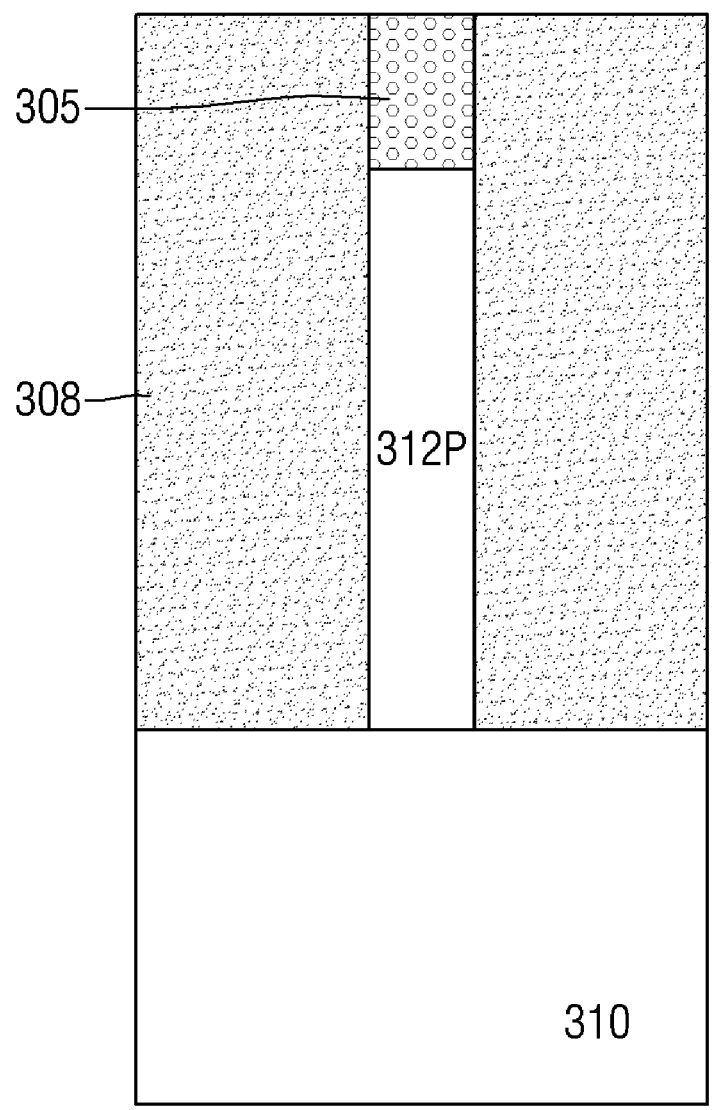
Figure 4B:
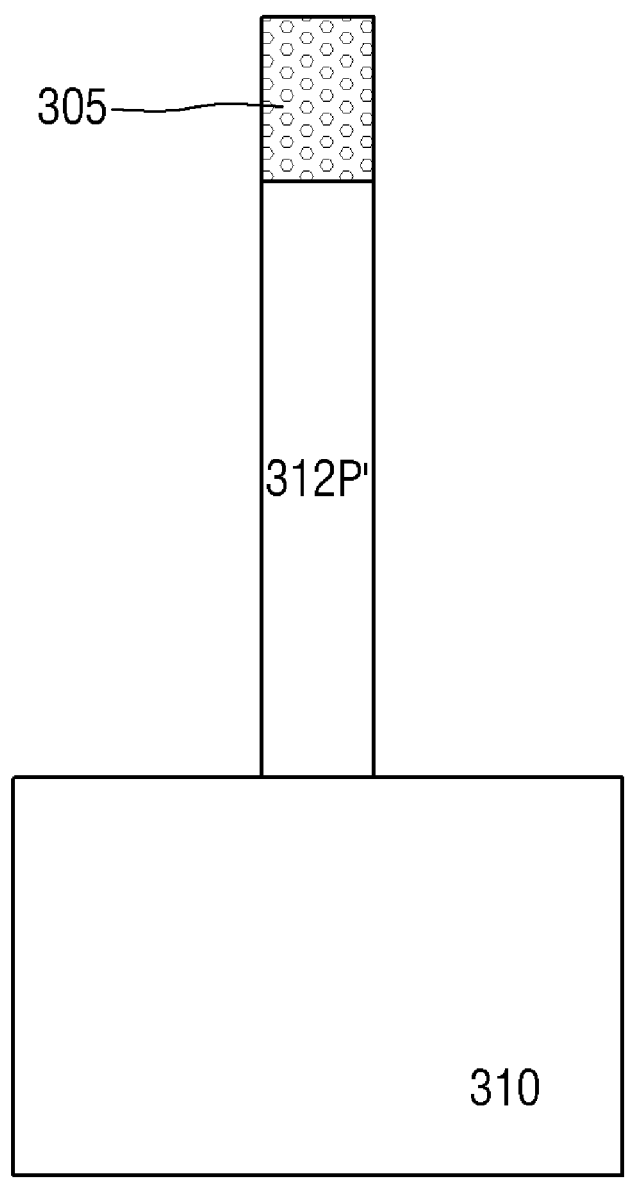

FIGS. 4A, 4B, 5A, and 5B are cross-sectional views to explain operation S204 of FIG. 2. Referring to FIGS. 4A and 4B, one or more fin recess mask pattern 308 may be provided to cover one or more portions of the semiconductor substrate 310 to expose one or more select regions of the semiconductor substrate 310. For example, the one or more fin recess mask pattern 308 may be formed by coating a dielectric mask layer (not shown) on the semiconductor substrate 310 to a sufficient height to cover all the structures on the semiconductor substrate 310, and by etching back the dielectric mask layer until the fin hard mask pattern 305 is exposed. Then, the dielectric layer at the one or more select regions of the semiconductor substrate 310 may be removed or etched using a mask pattern (not shown).

Figure 5A:
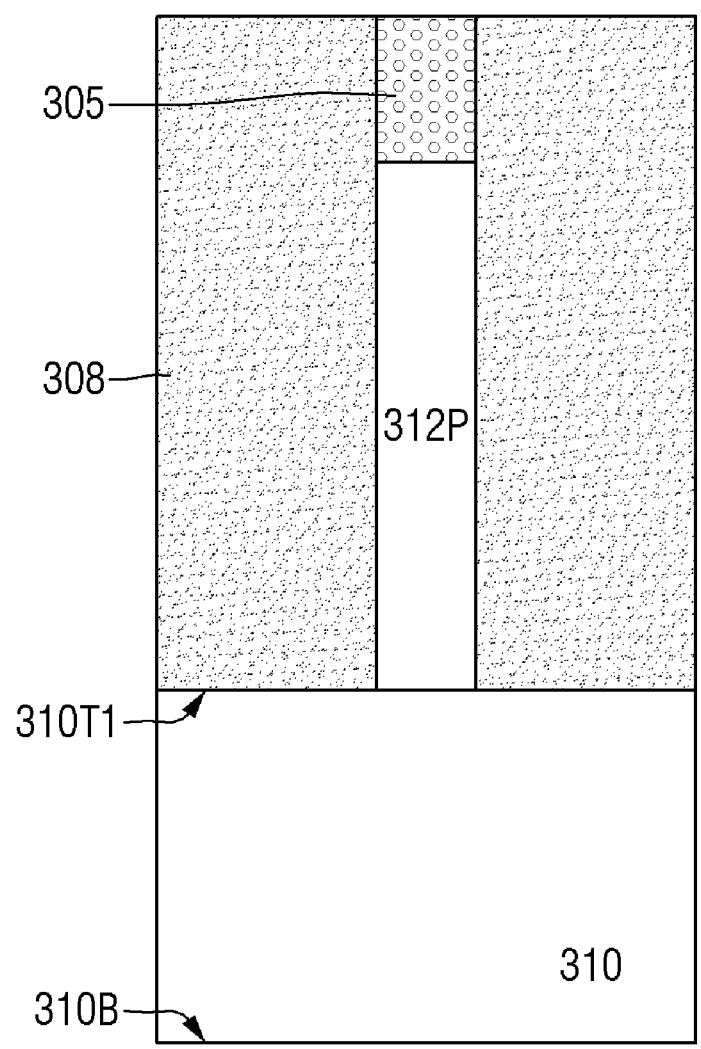
Figure 5B:
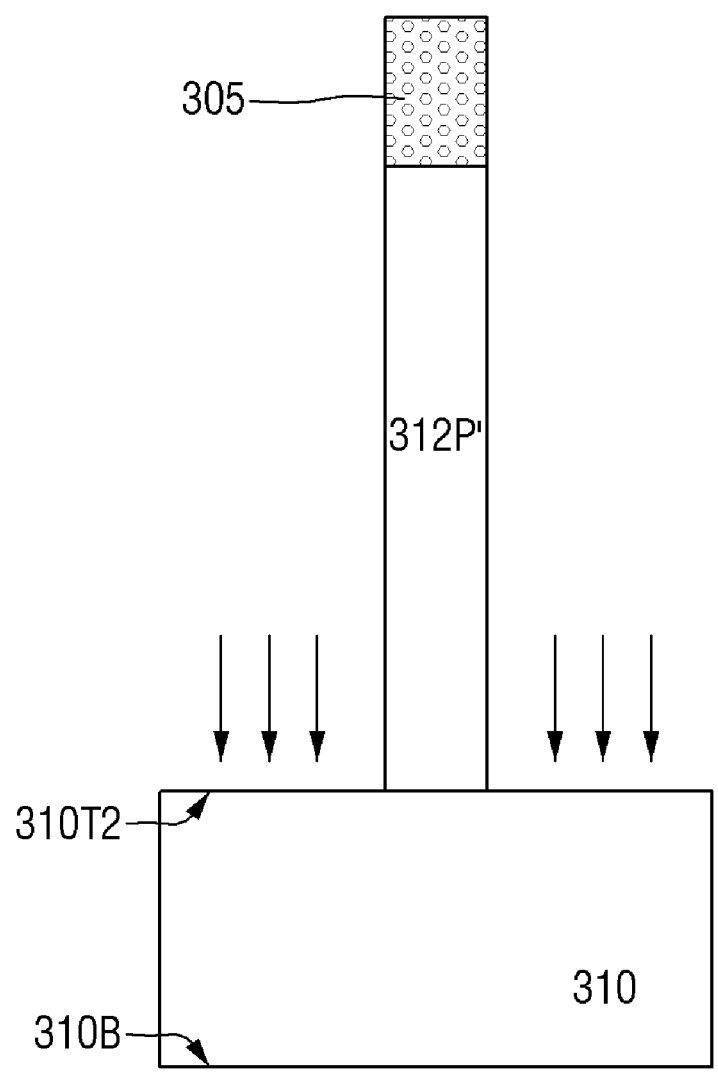

Subsequently, as illustrated in FIGS. 5A and 5B, the plurality of preliminary fins 312P exposed at the one or more select regions may be additionally etched using the one or more fin recess mask 308 as an etch mask so that a first fin 312 having a first thickness is formed in a non-select region of the semiconductor substrate 310 and a second fin 312' having a second thickness is formed in a select region of the semiconductor substrate 310.

Accordingly, the top surface of the semiconductor substrate 310 may be formed to include a first top surface portion (un-recessed portion of the top surface of the semiconductor substrate 310) 310T1 at a first height with respect to a bottom surface 310B of the semiconductor substrate 310 and a second top surface portion (recessed portion of the top surface of the semiconductor substrate 310) 310T2 at a second height with respect to the bottom surface 310B of the semiconductor substrate 310. The first height may be different from the second height.

Figure 6A:
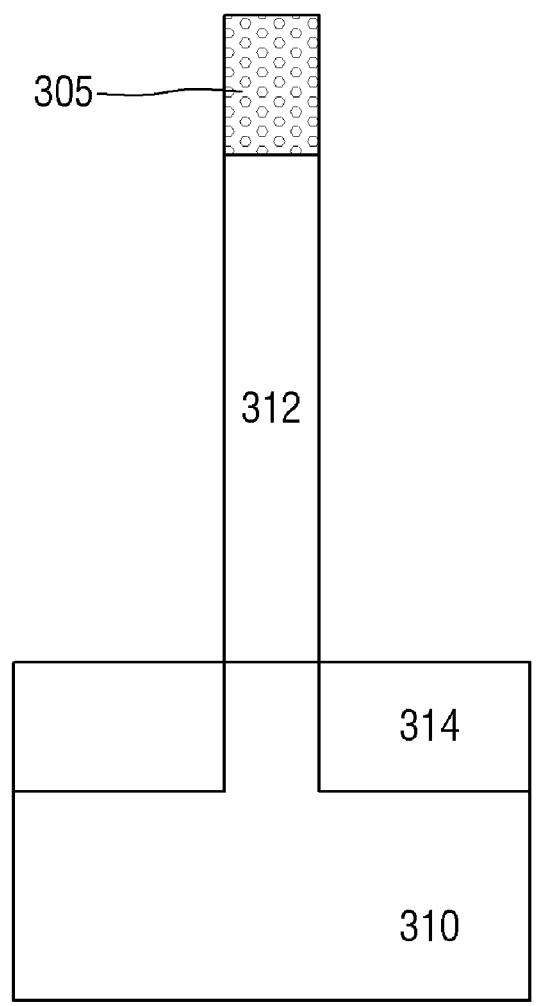
Figure 6B:
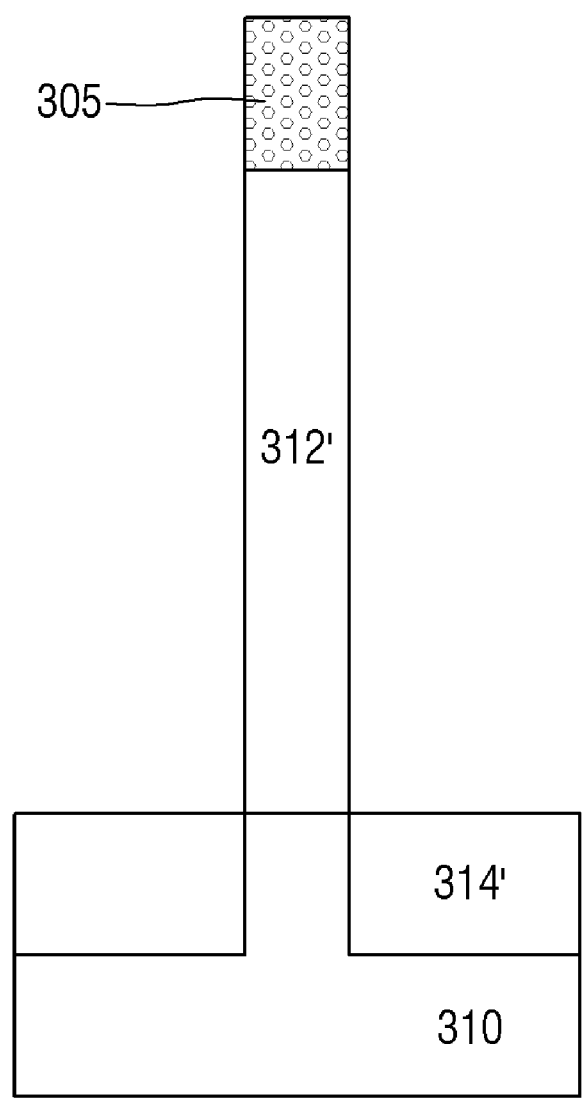

FIGS. 6A and 6B are cross-sectional views to explain operation S206 of FIG. 2. Referring to FIGS. 6A and 6B, a first bottom source/drain regions 314 and a second bottom source/drain region 314' may be formed at a side of the first fin 312 and at a side of the second fin 312', respectively.

For example, the semiconductor substrate 310 may be etched to form recesses at sides of the first fin 312 and at sides of the second fin 312' using the fin hard mask pattern 305 as an etch mask. Then, a plurality of bottom source/drain regions (e.g., the first bottom source/drain regions 314 and the second bottom source/drain region 314') may be formed by epitaxially growing an n+ doped semiconductor layer or a p+ doped semiconductor layer in a corresponding one of the recesses using a mask pattern. However, example embodiments of the present inventive concepts are not limited thereto. According to some example embodiments, the plurality of bottom source/drain regions may be formed by using an ion implantation process without forming the recesses.

Figure 7A:
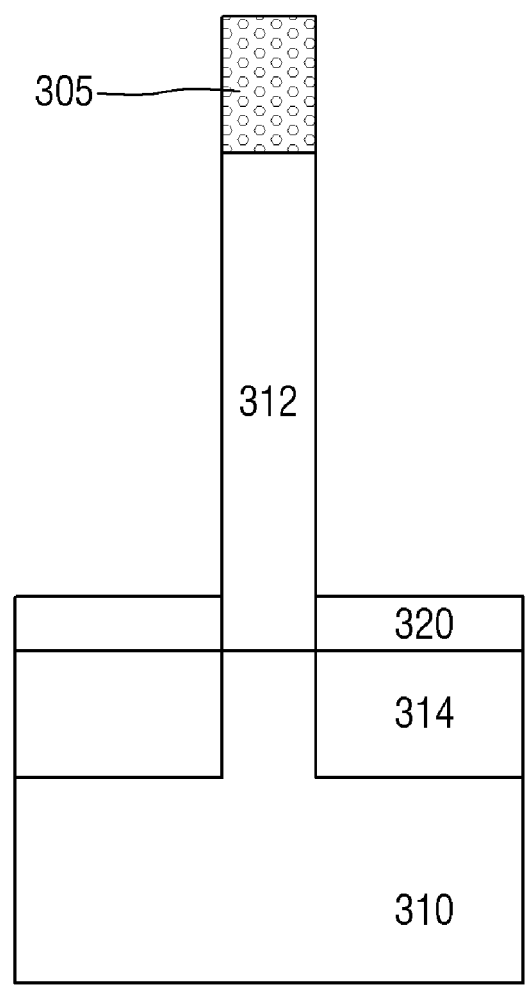
Figure 7B:
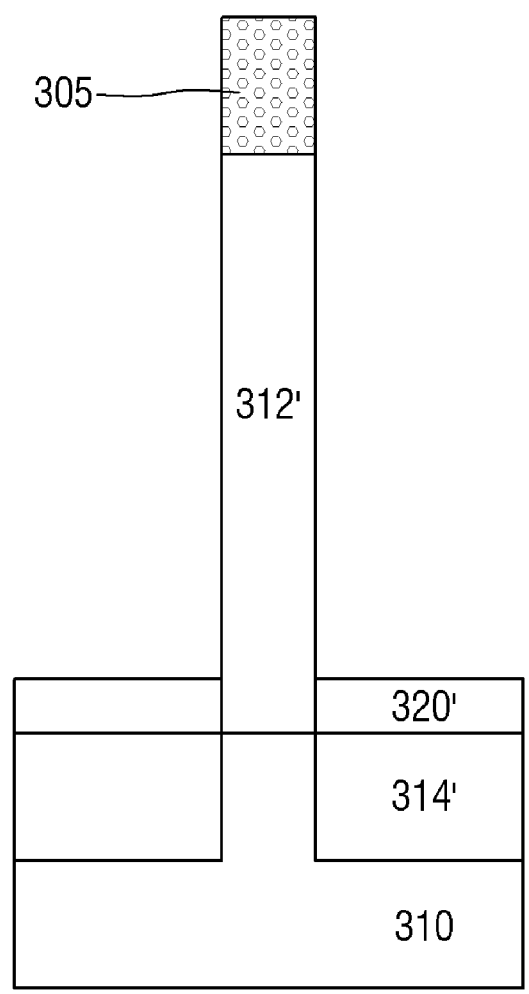

FIGS. 7A and 7B are cross-sectional views to explain operation S208 of FIG. 2. Referring to FIGS. 7A and 7B, a first bottom spacer pattern 320 may be provided at a side of the first fin 312, and a second bottom spacer pattern 320' may be provided at a side of the second fin 312'. The first bottom spacer pattern 320 and the second bottom spacer pattern 320' may be provided to cover the semiconductor substrate 110 exposed between the plurality of fins 312 and 312'. The first and second bottom spacer patterns 320 and 320'may include a silicon nitride (SiN) material.

Figure 8A:
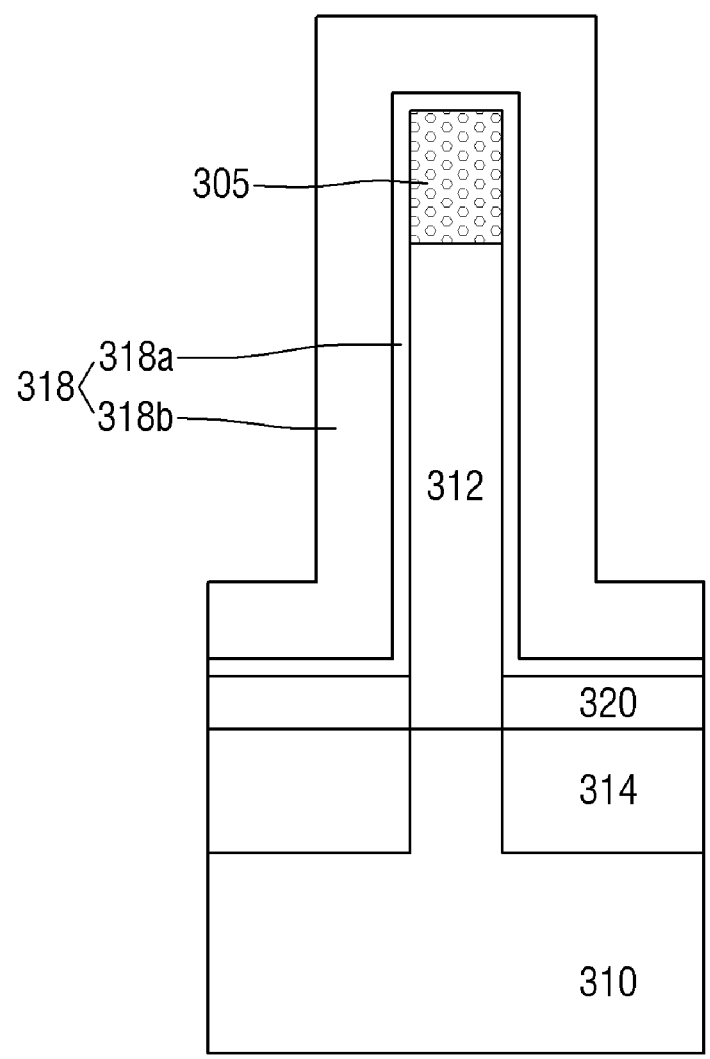
Figure 8B:
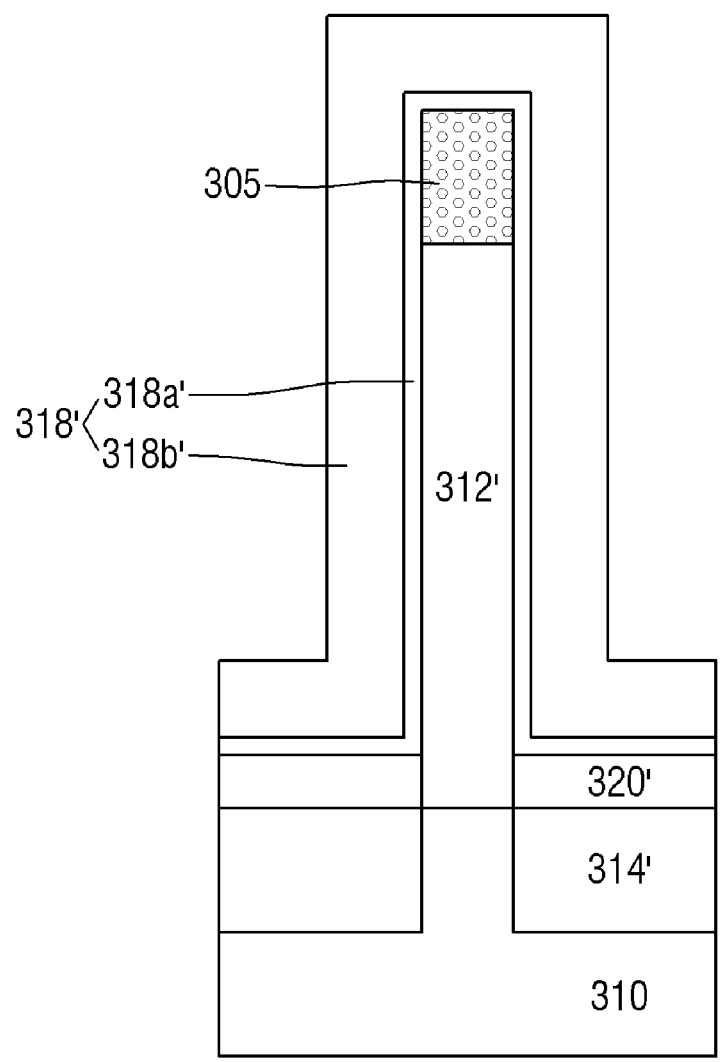

FIGS. 8A and 8B are cross-sectional views to explain operation S210 of FIG. 2. Referring to FIGS. 8A and 8B, a gate insulating layer 318a may be conformally deposited on the semiconductor substrate 310 that includes the plurality of fins (e.g., the first fin 312 and the second fin 312') and a gate conductive layer 318b may be conformally deposited on the gate insulating layer 318La. In other words, a stacked layer 318 of the gate insulating layer 318a and the gate conductive layer 318b may be conformally deposited on the semiconductor substrate 310 that includes the plurality of fins (e.g., the first fin 312 and the second fin 312').

The gate insulating layer 318a may include a high-k dielectric material.

In some example embodiments, the gate conductive layer 318b may include a stacked layer of a work function metal layer (not shown) and a capping metal layer (not shown).

The work function metal layer may be formed on the gate insulating layer 318a. A work function of the work function metal layer for a VFET may be determined based on material characteristics as well as a thickness of the work function metal layer. In some example embodiments, the work function metal layer may be implemented to have different thicknesses depending on locations.

The work function metal layer may include TiN. In some example embodiments, the work function metal layer may include titanium nitride (TiN) or titanium carbide (TiC).

The capping metal layer may be subsequently formed on the work function metal layer. The capping metal layer may include at least one of TiC, TiAlC, or TiAl.

Figure 9A:
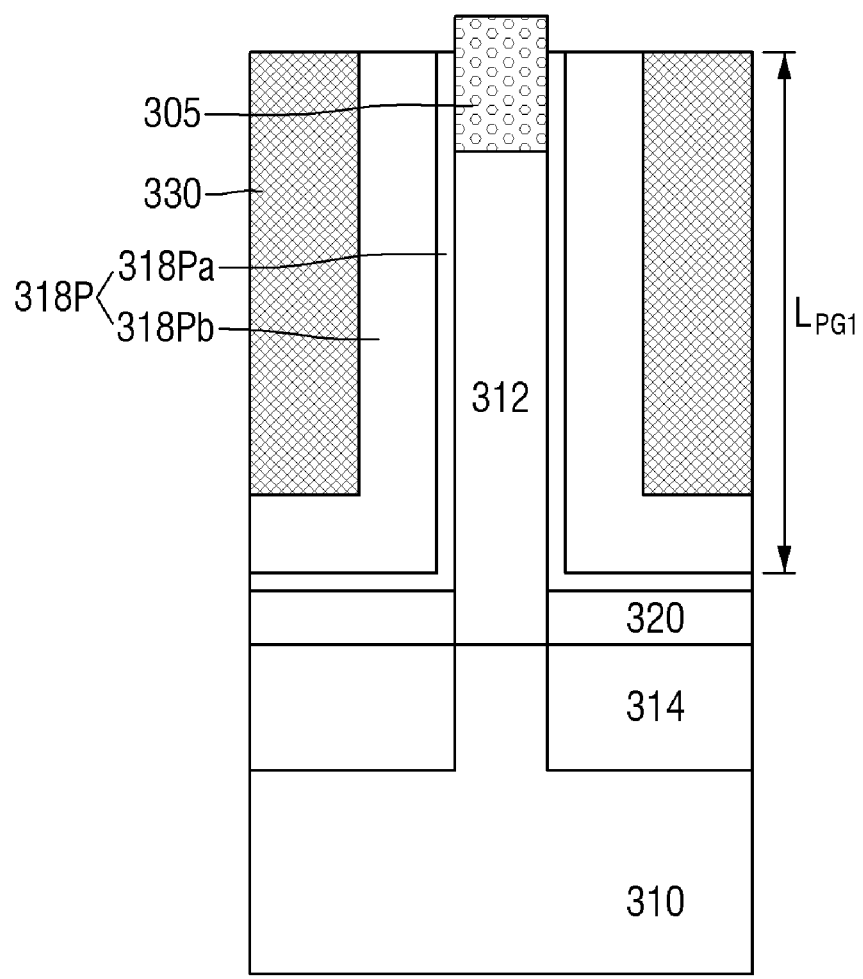
Figure 9B:
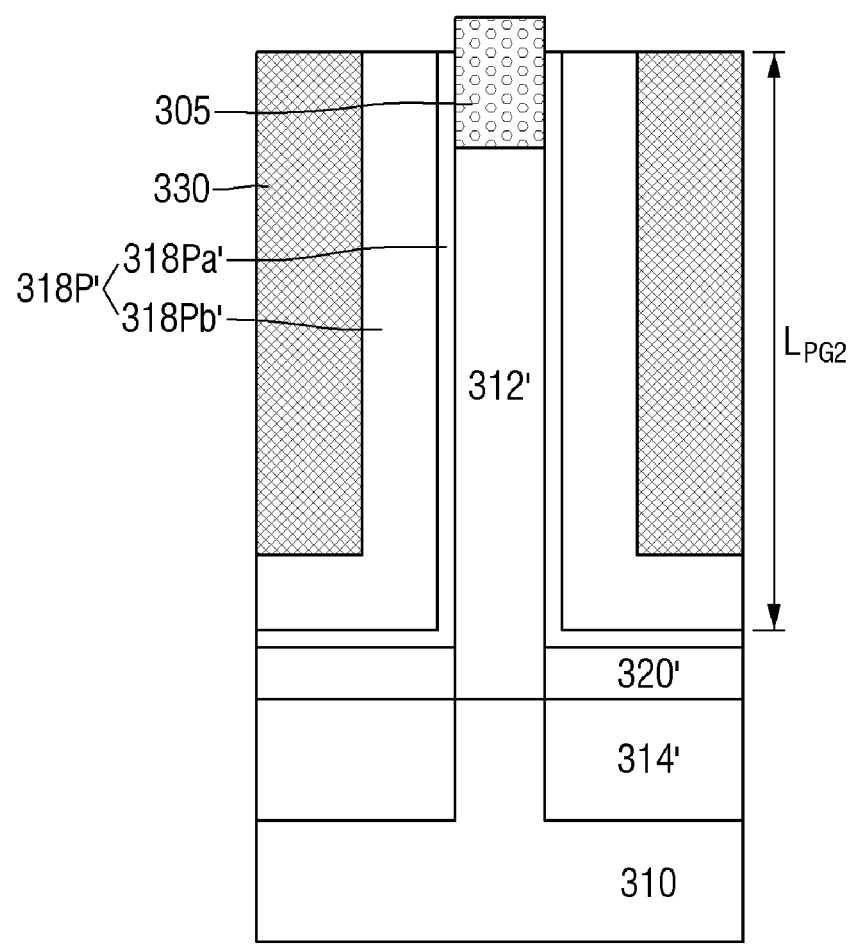

FIGS. 9A and 9B are cross-sectional views to explain operation S212 of FIG. 2. Referring to FIGS. 9A and 9B, a hard mask layer (not shown) may be deposited on the semiconductor substrate 310 that includes the plurality of fins (e.g., the first fin 312 and the second fin 312'), the gate insulating layer 318a, and the gate conductive layer 318b. In other words, the hard mask layer may be formed on the gate conductive layer 318b. The hard mask layer may include a silicon nitride (SiN) material.

Subsequently, the hard mask layer may be etched to form a hard mask pattern 330 around the sidewalls of the plurality of fins 312 and 312'. In other words, the hard mask layer may be etched to form the hard mask pattern 330 on the gate conductive layer 318b around the sidewalls of the plurality of fins 312 and 312'. In some example embodiments, the hard mask layer may be etched by using a reactive ion etch process. The hard mask pattern 330 may be formed on sides of a stacked structure of the plurality of fins 312 and 312' and the fin mask pattern 305 with the gate insulating layer 318a and the gate conductive layer 318b therebetween.

Top portions of the stacked structure 318 of the gate insulating layer 318a and the gate conductive layer 318b that are exposed by the hard mask pattern 330 may be removed or etched using the hard mask pattern 330 as an etch mask. The top portions of the gate stack structures 318 may be etched by a reactive ion etching or a wet etching process, which has a faster etching rate to the gate insulating layer 318a and the gate conductive layer 318b than to the hard mask pattern spacers 330. Thus, a plurality of preliminary gate structures (or interchangeably referred to as a plurality of preliminary gate stack structures) 318P and 318P' including a first preliminary gate structure 318P and a second preliminary gate structure 318P' may be formed. The first preliminary gate structure 318P including a first preliminary gate insulating pattern 318Pa and a first preliminary gate conductive pattern 318Pb may have a first length $L_{PG1}$ in a vertical direction. The second preliminary gate structure 318P' including a second preliminary gate insulating pattern 318Pa' and a second preliminary gate conductive pattern 318Pb' may have a second length $L_{PG2}$ in a vertical direction. The first length $LP_{PG1}$ of the first preliminary gate structure 318P may be different from the second length $L_{PG2}$ of the first preliminary gate structure 318P'. For example, the second length $L_{PG2}$ of the first preliminary gate structure 318P' may be greater than the first length $L_{PG1}$ of the first preliminary gate structure 318P. During this process, the fin hard mask pattern 305 may be exposed by the gate stack structures 318.

Figure 10A:
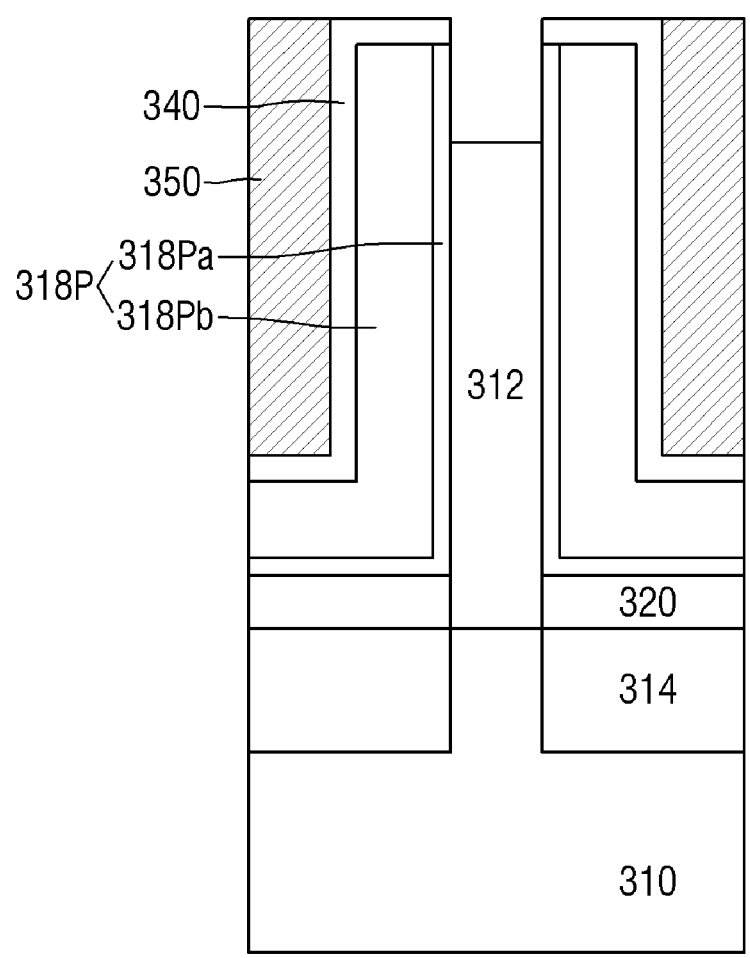
Figure 10B:
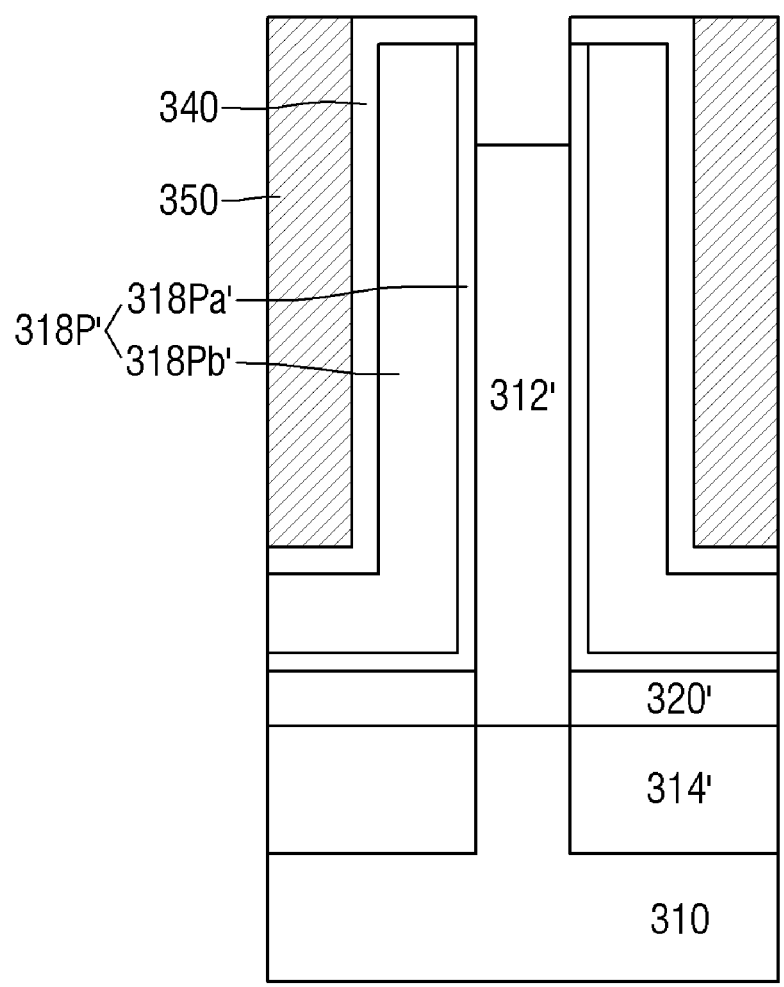

FIGS. 10A and 10B are cross-sectional views to explain operation S214 of FIG. 2. Referring to FIGS. 10A and 10B, the hard mask pattern 330 may be removed, for example, by a wet etching process that has an etch selectivity to a silicon nitride material. Then, a first dielectric layer (not shown) may be conformally formed on the plurality of preliminary gate stack structures 318P and 318P'. Then, a second dielectric layer (not shown) may be conformally formed on the first dielectric layer. For example, the first dielectric layer may include a silicon nitride (SiN) layer, and the second dielectric layer may include a silicon oxide material. The first and second dielectric layers may be recessed or etched back to expose the fin hard mask pattern 305 to leave a first dielectric pattern 340 and a second dielectric pattern 350. Subsequently, the fin hard mask pattern 305 exposed by the first and second dielectric patterns 340 and 350 may be pulled or removed by using the first and second dielectric patterns 340 and 350 as an etch mask.

Figure 11A:
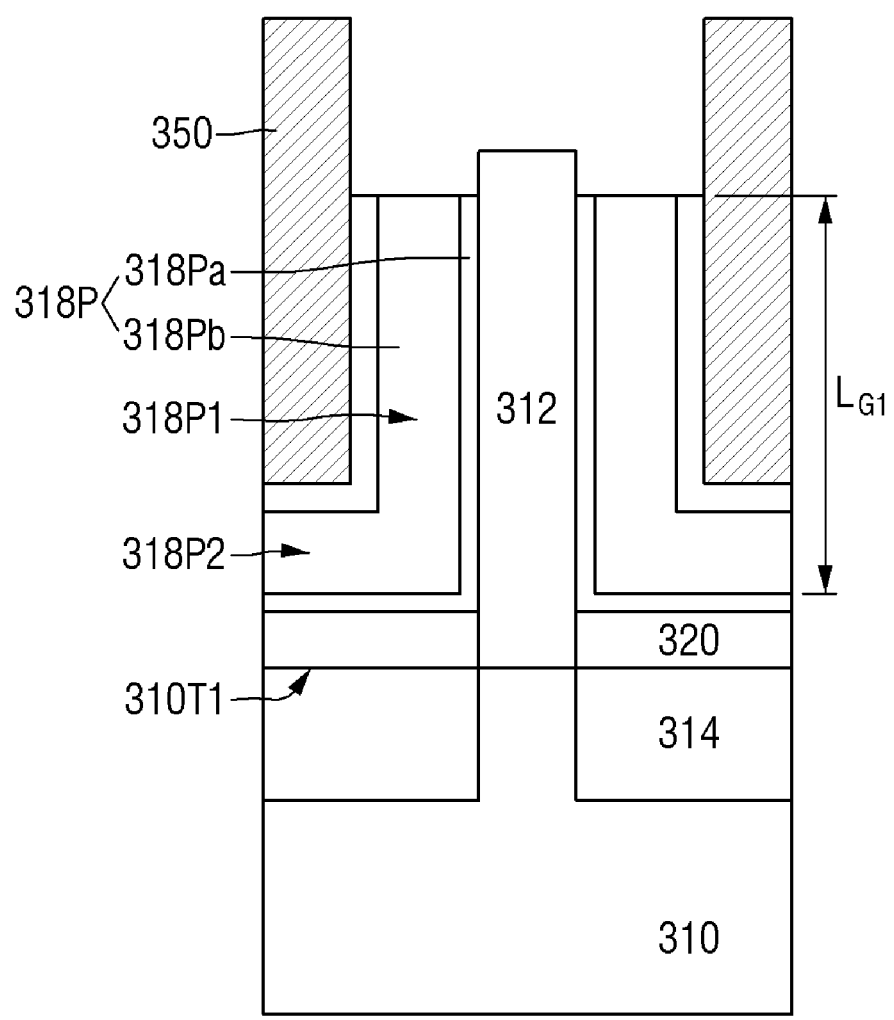
Figure 11B:
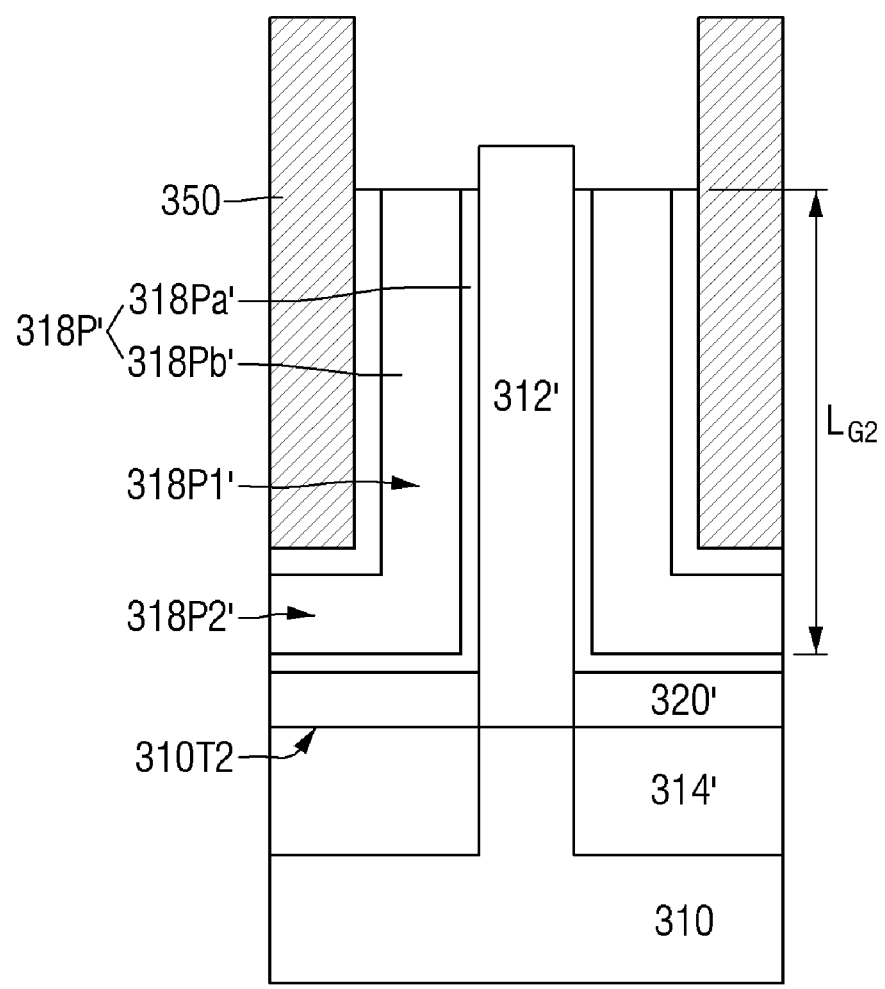

FIGS. 11A and 11B are cross-sectional views to explain operation S216 of FIG. 2. Referring to FIGS. 11A and 11B, the first gate structure (interchangeably referred to as first gate stack structure) 318L having a first gate length $L_{G1}$, and the second gate structure (interchangeably referred to as second gate stack structure) 318L' having a second gate length $L_{G2}$, which is greater than the first gate length, may be formed. For example, the first and second preliminary gate conductive patterns 318Pa and 318Pb, the first and second preliminary gate insulating pattern 318Pb and 318Pb', and the first dielectric pattern 340 may be recessed using the second dielectric pattern as an etch mask to form the first and second gate structures 318L and 318L'. The term "gate length" refer to a vertical length of a gate of a VFET in a vertical direction along a sidewall of a fin in which a channel of the VFET is formed. Thus, the first length $L_{G1}$ and the second length $L_{G2}$ may be interchangeably referred to as a first thickness and a second thickness, respectively.

As shown in FIG. 11A, the first gate structure 318L may be formed on a first top surface portion 310T1 of the semiconductor substrate 310, and may include, for example, the first gate insulating pattern 318La and the first gate conductive pattern 318Lb on the first gate insulating pattern 318La. The first gate structure 318L may include a first portion 318P1 surrounding the first fin 312 to the first thickness $L_{G1}$ from the first top surface portion 310T1 of the semiconductor substrate 310 and a second portion 318P2 on the semiconductor substrate 310 and connected to the first portion 318P1. The second portion 318P2 may be formed vertically on the first bottom spacer portion 320.

The second gate structure 318L' may be provided on a second top surface portion 310T2 of the semiconductor substrate 310, and may include, for example, the second gate insulating pattern 318La' and the second gate conductive pattern 318Lb' on the second gate insulating pattern 318La'. The second gate structure 318L' may include a third portion 318P1' surrounding the second fin 312' to the second thickness $L_{G2}$ from the second top surface portion 310T2 of the semiconductor substrate 310 and a fourth portion 310P2' on the second top surface portion 310T2 of the semiconductor substrate 310 and connected to the third portion 318P1'. The second portion 318P2' may be formed vertically on the first bottom spacer portion 320.

The first thickness $L_{G1}$ and the second thickness $L_{G2}$ may be different from each other. As shown in FIGS. 11A and 11B, the second thickness $L_{G2}$ may be greater than the first thickness $L_{G1}$. Further, a top of the first gate structure 318L and a top of the second gate structure 318L' may be substantially at a same level.

A top surface of the first fin 312 may be at a higher level than a top surface of the first gate stack structure 318. A top surface of the second fin 312' may be at a higher level than a top surface of the second gate stack structure 318'.

Figure 12A:
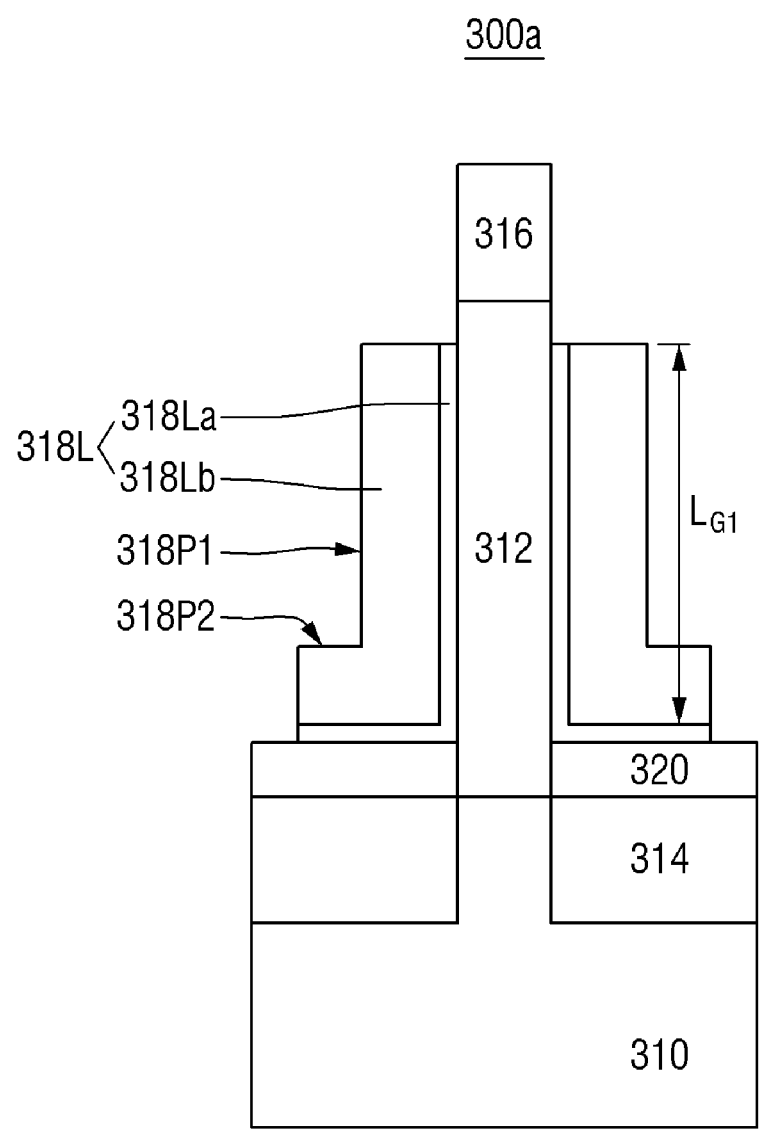
Figure 12B:
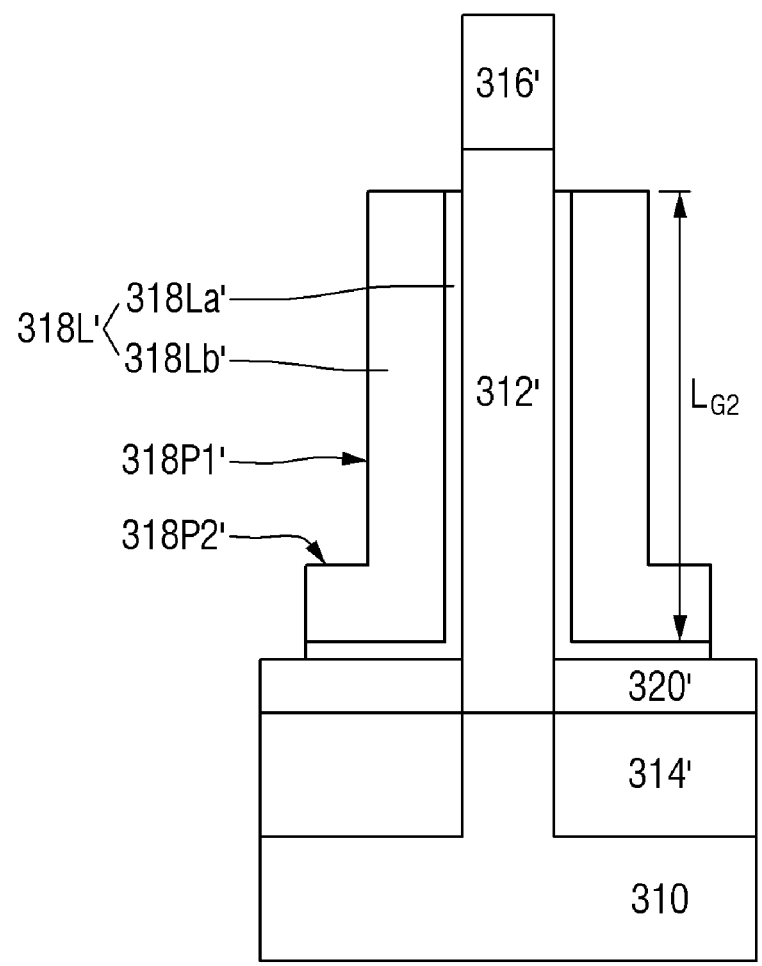

FIGS. 12A and 12B are cross-sectional views to explain operation S218 of FIG. 2. Referring to FIGS. 12A and 12B, a first top source/drain regions 316 and a second top source/drain region 316' (collectively referred to as "top source/drain regions") may be formed on the plurality of fins 312 and 312', respectively. The first and second dielectric patterns 340 and 350 may be removed.

Although not specifically illustrated in the drawings, the top source/drain regions 316 and 316' may be formed on top surfaces of the plurality of fins 312 and 312' to complete fabrication of VFETs.

In some example embodiments, the top source/drain regions 316 and 316' may be formed by epitaxially growing p+ or n+ doped semiconductor layers on corresponding ones of the plurality of fins 312 and 312'. However, example embodiments of the present inventive concepts are not limited thereto. According to some example embodiments of the present inventive concepts, the top source/drain regions 316 and 316' may be formed by using an ion implantation process.

Thus, a first VFET 300a including the first bottom source/drain region 312 in the semiconductor substrate 310 at both sides of the first fin 312 (which serves as a channel of the first VFET 300a), the first gate structure 318L surrounding a side surface of the first fin 312, and the first top source/drain region 316 on a top surface of the first fin 312, and a second VFET 300b including the second bottom source/drain region 314' in the semiconductor substrate 310 at both sides of the second fin 312' (which serves as a channel of the second VFET 300b), the second gate structure 318L' surrounding a side surface of the second fin 312', and the second top source/drain region 316' on a top surface of the second fin 312' may be formed. The first VFET 300a of FIG. 12A is the same as the first VFET 100a of FIG. 1A, and the second VFET 300b of FIG. 12B is the same as the second VFET 100b of FIG. 1B.

According to this example embodiment of the present inventive concepts, a semiconductor device including at least two VFETs having different gate lengths may be formed.

According to this example embodiment of the present inventive concepts, at least two VFETs included in a semiconductor device may be formed to have different gate lengths while having a top of the first gate structure and a top of the second gate structure substantially at a same level.

It should be understood that example embodiments described herein should be considered in a descriptive sense only and not for purposes of limitation. While some example embodiments have been particularly shown and described, it will be understood by one of ordinary skill in the art that variations in form and detail may be made therein without departing from the spirit and scope of the claims.

What is claimed is:

1. A semiconductor device including at least two vertical field effect transistors (VFETs) having different gate lengths, the semiconductor device comprising:
    a semiconductor substrate including a top surface and a bottom surface, the top surface including a first top surface portion at a first height with respect to the bottom surface of the semiconductor substrate and a second top surface portion at a second height with respect to the bottom surface of the semiconductor substrate, the first height being different from the second height;
    a first fin protruding from the first top surface portion of the semiconductor substrate;
    a second fin protruding from the second top surface portion of the semiconductor substrate, a top of the first fin and a top of the second fin being at a same level;
    a first gate structure on the first top surface portion of the semiconductor substrate, the first gate structure including a first gate insulating layer and a first gate conductive layer on the first gate insulating layer, the first gate structure surrounding the first fin to a first thickness from the top surface of the semiconductor substrate, the first gate structure including (1) a first portion vertically extending and surrounding the first fin and (2) a second portion on the semiconductor substrate and horizontally extending from a bottom area of the first portion, an entirety of the first portion being in contact with the first fin, an entirety of the second portion and the bottom surface of the semiconductor substrate being parallel to each other; and
    a second gate structure on the second top surface portion of the semiconductor substrate, the second gate structure including a second gate insulating layer and a second gate conductive layer on the second gate insulating layer, the second gate structure surrounding the second fin to a second thickness from the top surface of the semiconductor substrate, the first thickness and the second thickness being different from each other, the second gate structure includes (1) a third portion vertically extending and surrounding the second fin and (2) a fourth portion on the semiconductor substrate and horizontally extending from a bottom area of the third portion, an entirety of the third portion being in contact with the second fin, an entirety of the fourth portion and the bottom surface of the semiconductor substrate being parallel to each other.

2. The semiconductor device of claim 1, wherein the first height is at a higher level than the second height, and a top of the first gate structure and a top of the second gate structure are substantially at a same level.

3. The semiconductor device of claim 1, further comprising:
    a first spacer layer pattern between the second portion of the first gate structure and the semiconductor substrate; and
    a second spacer layer pattern between the fourth portion of the second gate structure and the semiconductor substrate.

4. The semiconductor device of claim 1, further comprising:
    a first bottom source/drain region in the semiconductor substrate and at a side of the first fin; and
    a second bottom source/drain region in the semiconductor substrate at a side of the second fin.

5. The semiconductor device of claim 4, further comprising:
    a first spacer layer pattern between the first gate structure and the first bottom source/drain region; and
    a second spacer layer pattern between the second gate structure and the second bottom source/drain region.

6. The semiconductor device of claim 4, further comprising:
    a first top source/drain region on the first fin; and
    a second top source/drain region on the second fin.

7. A semiconductor device including at least two vertical field effect transistors (VFETs) having different gate lengths, the semiconductor device comprising:
    a semiconductor substrate including a top surface having a recessed top portion and a non-recessed top portion;
    a first fin protruding upward from the non-recessed top portion of the semiconductor substrate and having a first thickness;
    a second fin protruding upward from the recessed top portion of the semiconductor substrate and having a second thickness, the second thickness being greater than the first thickness;
    a first gate structure on the non-recessed top portion of the semiconductor substrate, the first gate structure including a first gate insulating layer and a first gate conductive layer on the first gate insulating layer, the first gate structure protruding from the non-recessed top portion of the semiconductor substrate to a first height, the first gate structure including (1) a first portion vertically extending and surrounding the first fin and (2) a second portion on the semiconductor substrate and horizontally extending from a bottom area of the first portion, an entirety of the first portion being in contact with the first fin, an entirety of the second portion and a bottom surface of the semiconductor substrate being parallel to each other; and
    a second gate structure on the recessed top portion of the semiconductor substrate, the second gate structure including a second gate insulating layer and a second gate conductive layer on the second gate insulating layer, the second gate structure protruding from the recessed top portion of the semiconductor substrate to a second height, the first height and the second height being different from each other, the second gate structure including (1) a third portion vertically extending and surrounding the second fin and (2) a fourth portion on the semiconductor substrate and horizontally extending from a bottom area of the third portion, an entirety of the third portion being in contact with the second fin, an entirety of the fourth portion and the bottom surface of the semiconductor substrate being parallel to each other.

8. The semiconductor device of claim 7, wherein a top of the first fin and a top of the second fin are substantially at a same level.

9. The semiconductor device of claim 8, wherein a top of the first gate structure and a top of the second gate structure are substantially at a same level.

10. The semiconductor device of claim 7, wherein a top of the first gate structure and a top of the second gate structure are substantially at a same level.

11. The semiconductor device of claim 7, further comprising:
    a first spacer layer pattern between the second portion of the first gate structure and the non-recessed top portion of the semiconductor substrate; and a second spacer layer pattern between the fourth portion of the second gate structure and the recessed top portion of the semiconductor substrate.

12. The semiconductor device of claim 7, further comprising:
a first bottom source/drain region in the semiconductor substrate at a side of the first fin; and
a second bottom source/drain region in the semiconductor substrate at a side of the second fin.

13. The semiconductor device of claim 12, further comprising:
a first spacer layer pattern between the first gate structure and the first bottom source/drain region; and
a second spacer layer pattern between the second gate structure and the second bottom source/drain region.

14. A semiconductor device including at least two vertical field effect transistors (VFETs) having different gate lengths, the semiconductor device comprising:
a first VFET including,
a first fin serving as a first channel for the first VFET, the first fin protruding from a first portion of a top surface of a semiconductor substrate, and
a first gate structure surrounding a sidewall of the first fin, the first gate structure includes (1) a first portion vertically extending and surrounding the first fin and (2) a second portion on the semiconductor substrate and horizontally extending from a bottom area of the first portion, an entirety of the first portion being in contact with the first fin, an entirety of the second portion and a bottom surface of the semiconductor substrate being parallel to each other; and
a second VFET including,
a second fin serving as a second channel for the second VFET, the second fin protruding from a second portion of the top surface of the semiconductor substrate, the second portion being lower than the first portion, a top surface of the first fin being substantially at a same level as a top surface of the second fin, and
a second gate structure surrounding a sidewall of the second fin, a top of the second gate structure being substantially at a same level as a top of the first gate structure, the second gate structure including (1) a third portion vertically extending and surrounding the second fin and (2) a fourth portion on the semiconductor substrate and horizontally extending from a bottom area of the third portion, an entirety of the third portion being in contact with the second fin, an entirety of the fourth portion and the bottom surface of the semiconductor substrate being parallel to each other.

15. The semiconductor device of claim 14, further comprising:
a first spacer layer pattern between the second portion of the first gate structure and the semiconductor substrate and
a second spacer layer pattern between the fourth portion of the second gate structure and the semiconductor substrate.

16. The semiconductor device of claim 14, further comprising:
a first bottom source/drain region in the semiconductor substrate at a side of the first fin; and
a second bottom source/drain region in the semiconductor substrate at a side of the second fin.

17. The semiconductor device of claim 16, further comprising:
a first spacer layer pattern between the first gate structure and the first bottom source/drain region and
a second spacer layer pattern between the second gate structure and the second bottom source/drain region.

* * * * *